(12) United States Patent
Fedorov

(10) Patent No.: US 10,337,802 B2
(45) Date of Patent: Jul. 2, 2019

(54) EVAPORATION COOLING DEVICES AND SYSTEMS AND METHODS OF REMOVING HEAT FROM HOT SPOTS

(71) Applicant: Georgia Tech Research Corporation, Atlanta, GA (US)

(72) Inventor: Andrei G. Fedorov, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 15/516,125

(22) PCT Filed: Oct. 1, 2014

(86) PCT No.: PCT/US2014/058548
§ 371 (c)(1),
(2) Date: Mar. 31, 2017

(87) PCT Pub. No.: WO2016/053325
PCT Pub. Date: Apr. 7, 2016

(65) Prior Publication Data
US 2017/0314872 A1    Nov. 2, 2017

(51) Int. Cl.
| F28F 7/00 | (2006.01) |
| F28D 15/00 | (2006.01) |
| F28F 13/18 | (2006.01) |
| F28D 15/04 | (2006.01) |
| H01L 23/427 | (2006.01) |

(52) U.S. Cl.
CPC .......... *F28D 15/04* (2013.01); *F28D 15/046* (2013.01); *H01L 23/427* (2013.01); *F28F 13/187* (2013.01); *H01L 2924/0002* (2013.01)

(58) Field of Classification Search
CPC ...... F28F 13/187; F28D 15/04; F28D 15/046; H01L 23/4336; H01L 23/4735; H01L 23/427
USPC .............................. 165/80.4, 104.21, 104.26
See application file for complete search history.

(56) References Cited

U.S. PATENT DOCUMENTS

| 3,454,081 | A | 7/1969 | Kun |
| 3,457,990 | A | 7/1969 | Theophilos |
| 4,441,337 | A | 4/1984 | Kantor |
| 4,678,029 | A * | 7/1987 | Sasaki ............... F28F 13/187 165/133 |
| 5,259,448 | A * | 11/1993 | Masukawa ......... B21C 37/202 165/133 |
| 6,948,843 | B2 | 9/2005 | Laugharn, Jr. et al. |
| 2002/0000312 | A1* | 1/2002 | Brand ............... F28F 13/187 165/179 |
| 2009/0010819 | A1* | 1/2009 | Holmquist .......... B01F 17/0028 422/600 |
| 2011/0198059 | A1 | 8/2011 | Gavillet et al. |

(Continued)

FOREIGN PATENT DOCUMENTS

| WO | 0223115 A2 | 3/2002 |
| WO | WO 0223115 A2 * | 3/2002 ............ F28F 13/187 |

OTHER PUBLICATIONS

International Search Report for PCT/US2014/058548 dated Dec. 30, 2014.

*Primary Examiner* — Jason N Thompson
(74) *Attorney, Agent, or Firm* — Thomas Horstemeyer, LLP

(57) ABSTRACT

Capillary trap-vapor pumps, systems, methods of heat management, and the like, are disclosed.

10 Claims, 9 Drawing Sheets

(56) References Cited

U.S. PATENT DOCUMENTS

| | | | |
|---|---|---|---|
| 2012/0285664 A1* | 11/2012 | Kandlikar | B01D 1/00 165/104.29 |
| 2014/0090814 A1* | 4/2014 | Kondou | F28D 15/02 165/104.21 |
| 2014/0196498 A1* | 7/2014 | Xiao | H01L 23/427 62/524 |

* cited by examiner

A-A Cross-section

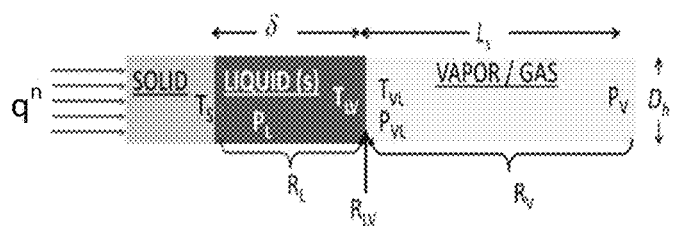
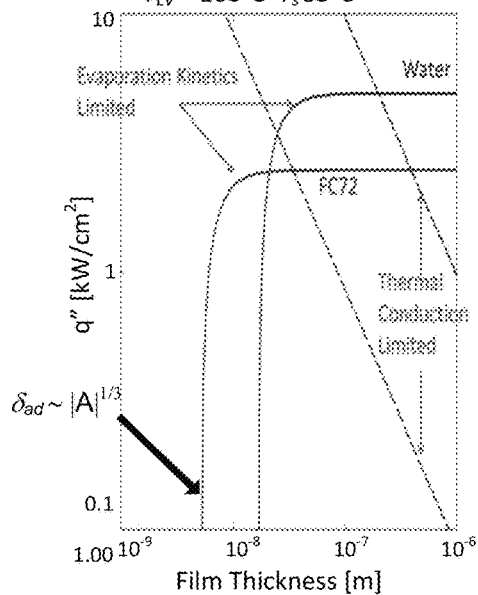
For very thin wetting films, evaporation is reduced due to van der Waal's attractive forces
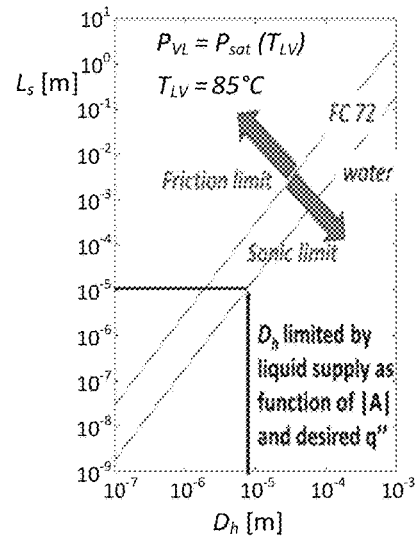
Vapor mass transport limited by friction if occurring over distance greater than cross over $L_s$
FIG. 4

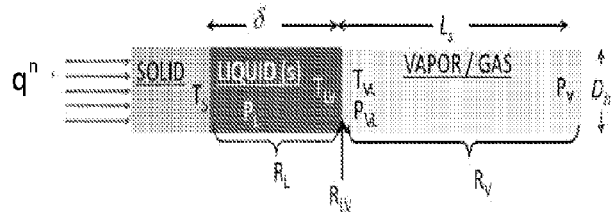
Capillary Limit: ability of curvature induced pressure gradient to supply required liquid flow
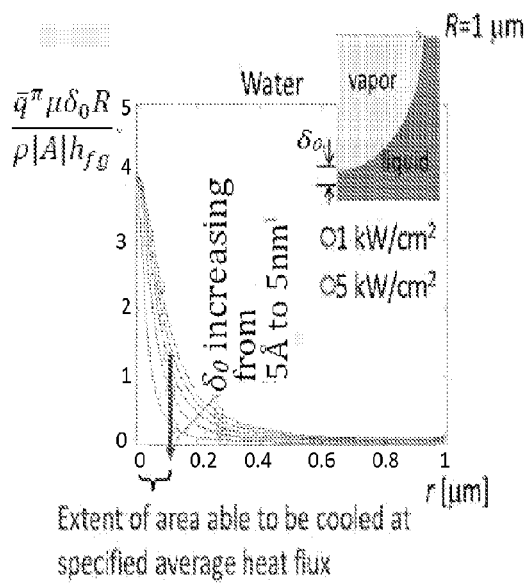
Extent of area able to be cooled at specified average heat flux
Vapor Limit: ability to remove vaporizing coolant away from the liquid-vapor interface
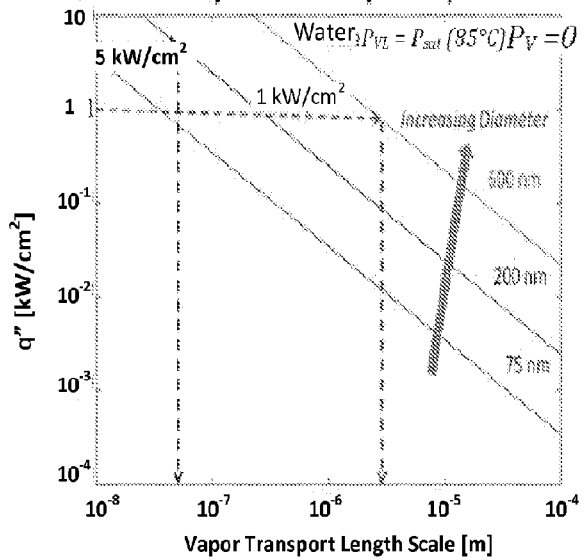
To achieve even small extent high heat flux cooling, vapor removal must occur over very short distance.
FIG. 5

Analysis of Cylindrical Bubble Forced Oscillation

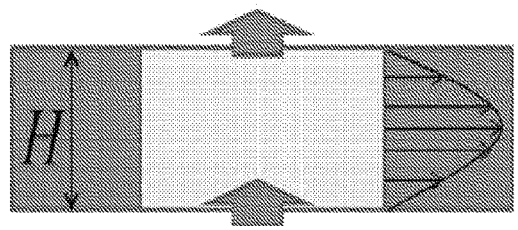

Mass and Momentum Conservation

$$\ddot{R} = -\frac{\dot{R}^2}{R}\left[1 - \frac{1 - \frac{R^2}{R_\infty^2}}{2\ln\left(\frac{R_\infty}{R}\right)}\right] + \frac{1}{R\ln\left(\frac{R_\infty}{R}\right)\rho}\left(P - P_\infty - \frac{\gamma}{R} - 2\mu\frac{\dot{R}}{R}\right) - \frac{12\mu}{\rho H^2}\dot{R}$$

$$p_\infty(t) = p_{\infty,0} + A\sin(\omega t)$$

$$\text{isothermal: } P = \frac{mRT}{\pi R^2 H}$$

$$\text{ICs: } R = R_0, \dot{R} = 0, m_0 = \frac{\pi H P_0 R_0^2}{RT}$$

$$\text{where } P_0 = p_{\infty,0} + \frac{\gamma}{R_0}$$

FIG. 7

Analysis of Cylindrical Bubble Forced Oscillation

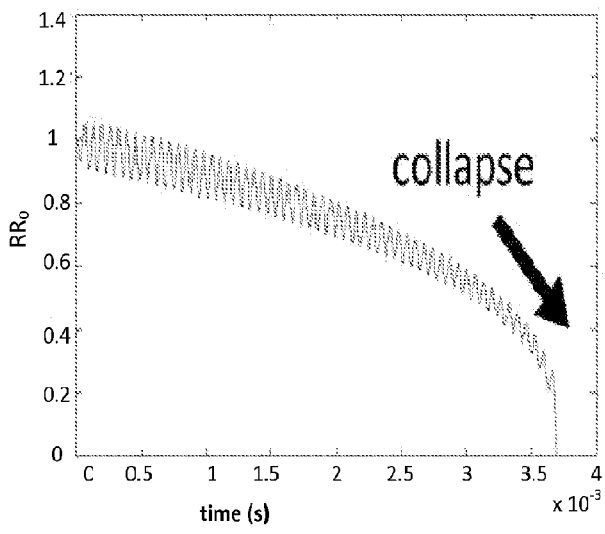

In Cylindrical Cavity: bubbles are inherently unstable and will collapse or expand uncontrollably based on very slight variations in initial conditions and forcing pressure.

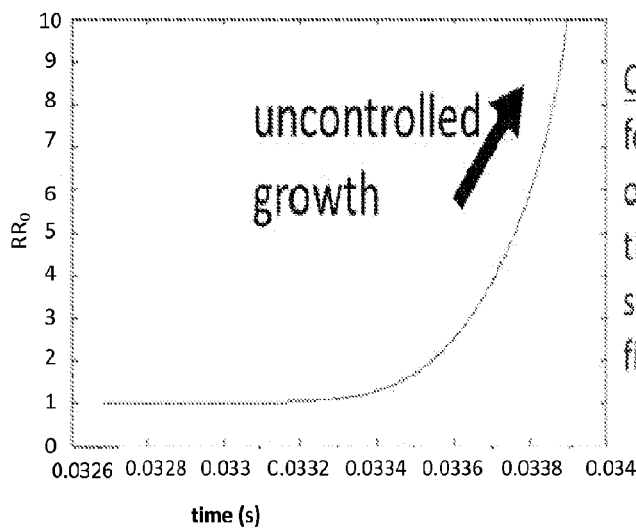

Conical Cavity is critical for stabilizing bubble oscillation and avoiding the bottom (heated) surface dry-out during film evaporation.

FIG. 8

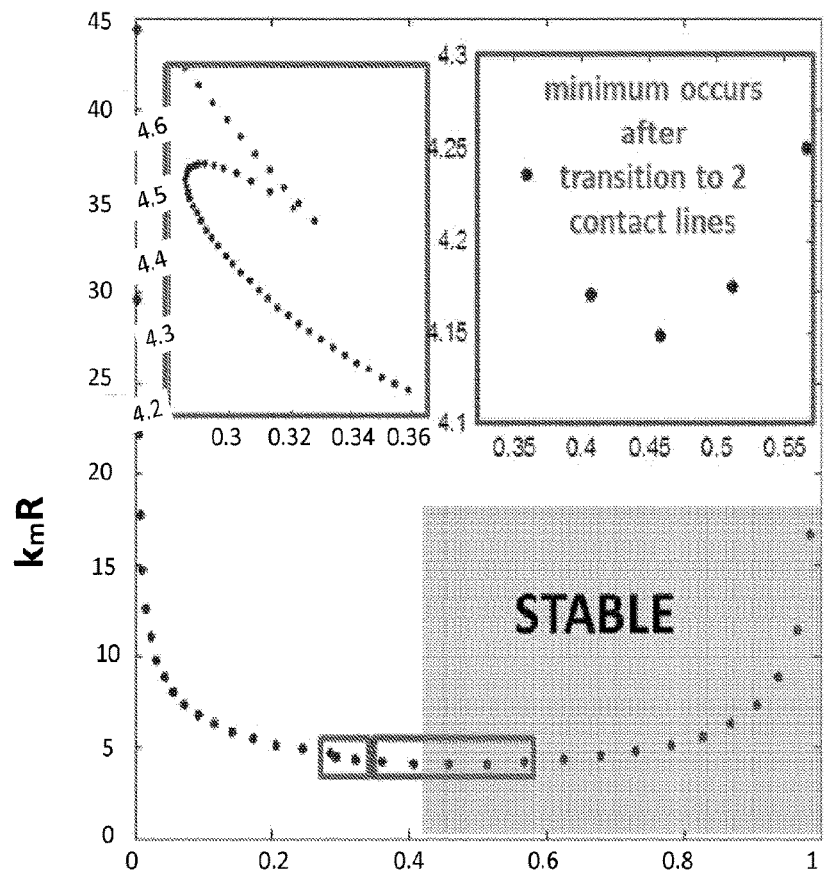
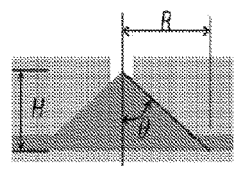
FIG. 9

EVAPORATION COOLING DEVICES AND SYSTEMS AND METHODS OF REMOVING HEAT FROM HOT SPOTS

STATEMENT REGARDING FEDERALLY SPONSORED RESEARCH

This invention was made with Government support under Award No. HR0011-13-2-0008 awarded by the Department of Advanced Research Projects Agency (DARPA). The government has certain rights in the invention.

CROSS-REFERENCE TO RELATED APPLICATION

This application is the 35 U.S.C. § 371 national stage application of PCT Application No. PCT/US2014/058548, filed Oct. 1, 2014, which is herein incorporated by reference in its entirety.

BACKGROUND

The current trend is to design electronic systems to provide more powerful systems in smaller package sizes. This trend signifies increased heat loads and dissipation needs while decreasing the package size and thus the package area available for heat dissipation. Consequently, improving the heat transfer from the heat source of a system to the ambient becomes a significant consideration for this kind of application. In particular, high performance microprocessors, especially power-limited chips, dissipate very significant power, leading to significant average heat fluxes over the entire chip area (~70-100 W/cm$^2$) as well as ultra high local heat fluxes at the location of hot spots (~1000-5000 W/cm$^2$). Thus, there is a need to provide solutions to remove this heat load.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 4 illustrates the analysis of dominant resistances to evaporation heat transfer in the steady-state, uniform thickness film approximation.

FIG. 5, left panel, illustrates how the ability to supply liquid into the cavity of the device (FIG. 1) due to the capillary pressure forces induced by interface curvature defines the maximum heat flux that can be dissipated due to liquid film evaporation. FIG. 5, right panel, illustrates the distance ($L_s$) that would be required for vapor removal from evaporating interface for two different value of the dissipated heat flux (1 kW/cm$^2$ and 5 kW/cm$^2$) and varying size/lateral extent of the evaporating film (water is a coolant).

FIG. 7 illustrates the effect of the cavity shape on the bubble/film stabilization upon forced oscillation—governing equations for analysis of the "cylindrical" vapor bubble behavior inside the cavity. R refers to the radius of the cavity, H is the cavity height, $\rho$ and $\mu$ are density and viscosity of the coolant, respectively, P and T are pressure and temperature, respectively, and $\gamma$ is the fluid surface tension. Subscript "0" refers to initial conditions, and "$\infty$" refers to the far-field (cavity outer walls).

FIG. 8 illustrates the effect of the cavity shape on the bubble/film stabilization upon forced oscillation—results of the analysis indicate that the cylindrical cavity (with the heated surface and the confining surface parallel to each other) is unable to stabilize the oscillatory vapor bubble upon coolant evaporation, which leads to either the bubble collapse (upper figure) or uncontrollable growth (lower figure); the conical (and other close in shape) cavity configuration is critical to achieve the stable vapor bubble within the cavity and to avoid the film dry-out at the bottom (heated) surface of the cavity.

FIG. 9 illustrates representative results—oscillating bubble stabilization is achieved within a conical cavity of the unity aspect ratio (height H/radius R=1) and the 30° apex angle when the bubble shape factor, defined by the maximum mean curvature normalized by the cavity radius R, reaches its minimum at the bubble volume equal to ~0.45 of the total volume of the cavity.

SUMMARY

Figure 1:
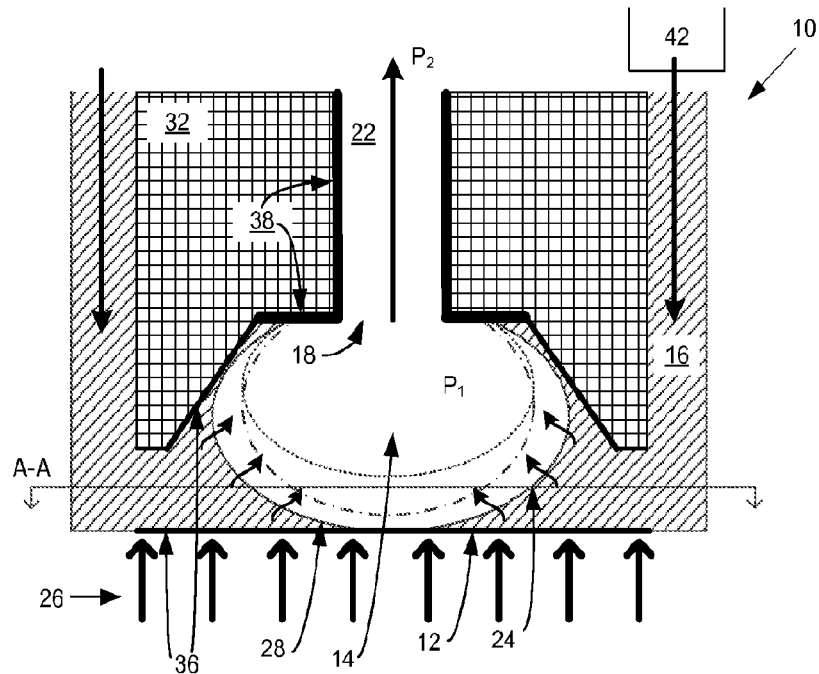
FIG. 1 illustrates a cross-sectional view of an embodiment of a capillary trap-vapor pump.

Capillary trap-vapor pumps, systems, methods of heat management, and the like, are disclosed. One exemplary capillary trap-vapor pump, among others, includes: a heated interface surface for receiving thermal energy, a contoured cavity adjacent the heated interface surface, at least one flow channel, wherein the flow channel is configured to flow a fluid to the heated interface surface, where the flow channels open into the contoured cavity; and a capillary opening disposed above the heated interface surface, wherein the capillary opening is the opening of a capillary tube, wherein the capillary opening forms a top boundary of the contoured cavity, wherein the heated interface surface forms a boundary of the contoured structure, wherein a contoured structure forms a side boundary of the contoured cavity; wherein the heated interface surface causes the fluid to evaporate and form a vapor bubble within the contoured cavity, wherein the vapor within the vapor bubble is removed using the capillary tube. It should be noted that "top", "bottom", and "side" (e.g., in reference to boundary, for example) are only used for clarity of description in respect to the location of the hot spot (at the "bottom" of the cavity), and is independent of the direction of gravity (i.e., the device should operate largely independently of the gravitation forces).

One exemplary method of removing heat, among others, includes: flowing a fluid to a contoured cavity and a heated interface surface so that the fluid contacts the heated interface surface, wherein the heated interface surface is in communication with a hot spot having a heat flux of about 100 W/cm$^2$ to 1 kW/cm$^2$; evaporating the fluid due to heat transfer from the heated interface surface to the fluid; forming a vapor bubble, wherein a thin layer of the fluid is a boundary of at least a portion of the vapor bubble, wherein the vapor bubble extents down from the capillary opening, wherein the vapor bubble is confined to the contoured cavity; and removing vapor through the capillary opening.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of physics, thermodynamics, heat transfer, chemistry, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DISCUSSION

Capillary trap-vapor pumps, systems, and methods of heat management, are disclosed. Embodiments of the present disclosure provide for heat transfer using phase change from a fluid to a gas without the detrimental problems associated with surface dry-out when the heat flux exceeds the critical heat flux of the device. Embodiments of the present disclosure can be used in microelectronics, in particular in cooling high performance computer chips and other IT devices such as those used in the military and other demanding fields and environments.

Embodiments of the capillary trap-vapor pump are advantageous for at least the following reasons: (1) low or no total pumping power input required for operating capillary trap-vapor pump, (2) it has a self-regulation capability of sustaining the thin liquid film structure, most efficient for evaporative heat transfer, and effectively supplying the coolant to the evaporating cavity at the flow rate matching the dynamically changing needs for heat dissipation, (3) it provides a capability for enhanced vapor removal away from the cavity to minimize the gas-phase mass transfer limitation on thermal performance, (4) it has a capability for addressable on-demand cooling of one or more hot spots on the heat generating structure (e.g., chip), which can be dynamically reconfigured as the heat dissipation profile (location and heat flux magnitude of hot spots) changes in the course of operation, (5) it allows for high degree of integration and device/system compactness, and (6) it features simplicity of design and packaging, as well as modularity of design of the capillary trap-vapor pump.

The fluid/vapor flow using this type of cooling approach is driven, at least in part, by the changing liquid/vapor interface curvature as the fluid evaporates and the vapor flows away from the heat flux, and the heat transfer rate is limited, at least in part, by (1) ability to replenish liquid, (2) evaporation kinetics to transfer coolant molecules from the liquid to gas (vapor) phase at the liquid-vapor interface, and/or (3) ability to rapidly remove vapor away from the interface to the ambient. In passive micro-film evaporative cooling the capillary pressure gradient drives flow, and local heat flux increases with decreasing film thickness until the thickness reaches the length scale over which van der Waal's forces from the solid surface affect the evaporation rate at the interface. For higher heat fluxes, greater liquid flow rates are required, resulting in a more rapid reduction in film thickness, and limiting the extent over which cooling is effective. It has been theoretically determined that for hot spots of about 100 nm' or larger the liquid supply limit influences the heat transfer.

Embodiments of the present disclosure can be used to overcome prior limitations. Embodiments of the present disclosure use cavity stabilization of the oscillating vapor bubble, induced, for example, by an external pressure transducer and amplified by using the resonance behavior of the contoured cavity when the transducer induces oscillations of the pressure at a frequency matching the natural frequency of the contoured cavity, in which the three phase (solid/liquid/vapor) contact line is driven back and forth across the heated surface and the walls of the contoured cavity, replenishing the evaporating thin film of fluid to effectively transfer heat from the hot spot using the capillary trap-vapor pump. Stabilization of the vapor bubble over a heat flux uses an increase in interface curvature due to an appropriately shaped contoured cavity with increasing bubble volume as the vapor bubble is trying to expand and become squeezed into the corners of the contoured cavity (see example depicted in FIG. 6), which is accomplished through judicious selection of contoured cavity cone angle (e.g., in some embodiments between 30° and 60°) and surface properties of the hydrophilic inner surface of the contoured cavity (e.g., contact angle of about 30-60°) and capillary tube (e.g., a hydrophobic vapor escape tube) (e.g., contact angle of about 120-150°). Rewetting uses pressure oscillations that overcome inertial resistance as validated by computational fluid dynamics simulations, which can be accomplished using hydrophilic materials or using hydrophilic coatings on the appropriate surfaces (FIG. 6) within the cavity of the capillary trap-vapor pump. During rewetting, cooling is enhanced by transient conduction. The rewetting speed is determined by the ratio of the cooling capacity of the moving meniscus of the vapor bubble and the total required heat transfer rate. Embodiments of the present disclosure use cavity stabilization of the vapor bubble and enhanced rewetting in the capillary trap-vapor pump to overcome at least some of the obstacles previously encountered. Embodiments of the present disclosure use capillary driven thin liquid films around the vapor bubble for evaporative cooling to remove high heat fluxes (e.g., about 100 W/cm$^2$ to 1 kW/cm$^2$) at a hot spot maintained at elevated temperatures (e.g., 50 to 100° C.), where the vapor is removed through the capillary opening to the cavity filled with coolant.

Embodiments of the capillary trap-vapor pump are interfaced with a heat generating structure that is in contact with a heated interface surface, directly or indirectly, of the capillary trap-vapor pump. In an embodiment, the capillary trap-vapor pump functions to remove heat from the hot spots of the heat generating structure. It should be noted that two or more capillary trap-vapor pumps could be used to enhance heat dissipation from a single hot spot or used to enhance heat dissipation of multiple hot spots.

In an embodiment, the capillary trap-vapor pump can be used in conjunction with a global heat dissipater structure is disposed (e.g., directly (in direct contact) or indirectly (in indirect contact (e.g. an interface structure disposed between the structures))) on a portion or over the entirety of the heat generating structure. In an embodiment, the global heat dissipater can be a global heat sink for a heat generating structure such as a computer chip. The global heat dissipater structure may include global heat dissipater fluid conduits of various number and shape, such as a single slit or multiple micro or mini channels, as well as fins, pin-fin arrays, or other extended surfaces commonly used for heat transfer enhancement. The capillary trap-vapor pump can be disposed on the global heat dissipater and on at least one hot spot of the heat generating structure. The capillary trap-vapor pump can be positioned adjacent at least one hot spot or multiple capillary trap-vapor pumps can be used for a single hot spot or to remove heat from different hot spots.

The heat generating structure can be a structure such as, but not limited to, a computer chip, an electronic component, a display, an engine, a fuel cell or other power generation device (e.g., solar cell), a chemical reactor, a light source, and the like. The heat generating structure includes areas of ultra high local heat fluxes at the location of hot spots (e.g., about 1 to 5 kW/cm$^2$ or about 100 to 500 W/cm$^2$, for example in a computer chip). The heat generating structure can include one or more hot spots. The hot spots can be independently monitored to determine when the hot spots are at elevated temperatures and require cooling. In addition, the locations of hot spots can be determined prior to use, so that the heat management device or system can be properly designed to place and activate the appropriate capillary trap-vapor pump devices as needed.

The heat from the heat generating structure (e.g., directly (in direct contact) or indirectly (in indirect contact via thermal interface material) cause a heated interface surface of the capillary trap-vapor pump to increase in temperature. As described in more detail below, a fluid is directed to flow onto heated interface surface to dissipate heat from the hot spot through evaporation. In other words, the heat from the heat generating structure is thermally communicated to the fluid via contact with the heated interface surface and transferred to a vapor that can be removed from the area of the heated interface surface.

Now having briefly described the process, embodiments of the present disclosure will be discussed in greater detail. Embodiments of the present disclosure provide for a capillary trap-vapor pump that includes the heated interface surface for receiving (e.g., directly or indirectly) thermal energy from a hot spot; a contoured cavity adjacent the heated interface surface; at least one flow channel (e.g., 1 to 20 or about 1 to 8) that is configured to flow the fluid to the heated interface surface, where the flow channels open into the contoured cavity; and a capillary opening disposed above the heated interface surface, where the capillary opening forms an open top boundary of the contoured cavity. The walls of the flow channel provide an additional path by heat conduction from the heated bottom surface to the fluid in the cavity, thereby increasing an overall solid-liquid contact area available for heat transfer. In an embodiment, a transducer can be used to pump the fluid through the flow channel(s) into the contoured cavity and to induce dynamic oscillations of the vapor bubble. In an embodiment, the shape of the contoured cavity should provide a large specific surface area (per unit volume) to be covered by a liquid film and sharp external corner areas to provide a mechanism for the oscillatory vapor bubble stabilization by an increase in the radius of curvature as the liquid film recedes during the coolant evaporation.

In an embodiment, the capillary trap-vapor pump can operate by flowing (e.g., pumped using a transducer) a fluid to the contoured cavity and the heated interface surface so that the fluid contacts the heated interface surface. In an embodiment, the transducer operates to induce mechanical disturbance to the liquid/vapor interface of the bubble. Thermal energy from the heated interface surface causes the fluid to evaporate and form a vapor bubble on the capillary opening. As more vapor is generated, the volume of the vapor bubble increases. The volume of the vapor bubble increases and decrease in size as a function of the fluid flow, heat flux, vapor flow through capillary opening, surface properties (contact angle) of the materials comprising the cavity walls, oscillation frequency of the transducer, and the like. A thin layer of fluid is positioned between the vapor bubble and the contoured cavity except on the portion of the bubble adjacent the capillary opening. In this regard, the vapor bubble is confined and stabilized in a quasi-steady state or in a periodic oscillatory state by the contoured cavity and the capillary opening. Vapor from the vapor bubble is removed through the capillary opening. In this regard, the pressure in the vapor bubble is relatively higher than the pressure within the capillary so that vapor flows out of the vapor bubble. In this way, heat is transferred from the heated interface surface as the fluid is evaporated and the vapor is flowed through the capillary tube. In an embodiment, the side and bottom surface of the contoured cavity are hydrophilic, while the top surface of the contoured cavity and the inside surface of the capillary tube are hydrophobic, where these properties stabilize the vapor bubble and forming a thin liquid film contacting the surface of the cavity, so that heat can be efficiently transferred.

The fluid may be a conductive or dielectric liquid (e.g., water or liquid refrigerant or fluorocarbon such FC-72) or combination of liquids. The main function of the fluid is to dissipate through evaporation the average (e.g., chip-level) heat load of the heat generating structure. In an embodiment having a power dissipation that is sufficiently large (e.g., >50 W/cm$^2$), the fluid can be a liquid such as, but not limited to, water, a fluorocarbon (e.g., FC-72), a refrigerant (e.g., liquid $CO_2$, R134a, and the like), and a combination thereof.

Figure 2A:
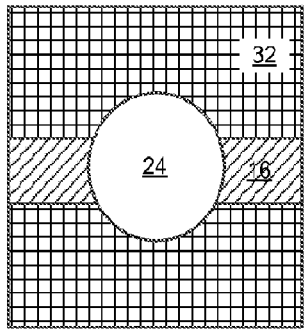
FIG. 2A illustrates a cross-sectional view along the A-A axis of an embodiment of the capillary trap-vapor pump shown in FIG. 1.
Figure 2B:
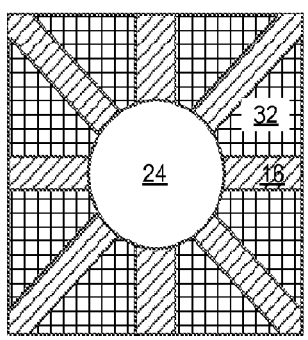
FIG. 2B illustrates a cross-sectional view along the A-A axis of another embodiment of the capillary trap-vapor pump shown in FIG. 1.
Figure 2C:
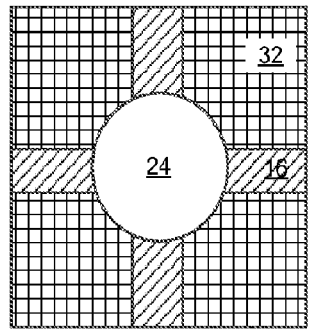
FIG. 2C illustrates a cross-sectional view along the A-A axis of another embodiment of the capillary trap-vapor pump shown in FIG. 1.

Now having described embodiments of the present disclosure in general, reference is now made to the figures to describe a particular embodiment. FIG. 1 illustrates a cross-sectional view of an embodiment of the capillary trap-vapor pump 10. The capillary trap-vapor pump 10 includes a heated interface surface 12, a contoured cavity 14, flow channels 16, and a capillary opening 18 of a capillary tube 22. FIG. 1 illustrates a vapor bubble 24 formed by evaporating the fluid, where a thin film of the fluid 28 surrounds a portion of the vapor bubble 24. The dashed lines represent the increase and decrease of the volume of the vapor bubble 24 as the fluid is evaporated and the vapor is flowed through the capillary opening. FIGS. 2A, 2B, and 2C illustrate embodiments of cross-sections of the capillary trap-vapor pump 10 along the A-A view, where 2, 4, or 8 flow channels are illustrated, respectively.

In an embodiment, the heated interface surface 12 can be made of materials such as silicon, silicon carbide, gallium arsenide, metal (e.g., copper, aluminum, brass), composite materials, polymers, carbon, diamond, or a combination thereof. In an embodiment, when the coolant is water, the material of the heated interface surface 12 can be hydrophilic or include a hydrophilic coating such as silicon dioxide, metals and metal oxides. As mentioned above, the hydrophilic characteristic improves wettability of the surface and operation of the capillary trap-vapor pump. In an embodiment, the heated interface surface 12 can have an area of about 10,000 nm$^2$ to 10,000 µm$^2$. In an embodiment, the distance from the heated interface surface 12 to the capillary opening 18 is about 10 nm to 300 µm.

In an embodiment, the contoured cavity 14 has a three dimensional shape that facilitates the formation of a stable vapor bubble 24. In an embodiment, the contoured cavity 14 can be defined by the heated interface surface 12, the end of the flow channels 16, a contoured structure 32, and the capillary opening 18. In an embodiment, the three-dimensional shape can be a cone-type shape (as shown in FIG. 1), exponential horn-type shape with concave or convex wall, onion dome-type shape, or a combination thereof. In an embodiment, the contoured structure 32 can be designed to produce the desired shape, for example, the contoured structure 32 can be tapered (slanted) towards the capillary opening in a cone-type shape. In an embodiment, the contoured cavity can have a volume of about 100,000 nm$^3$ to 100,000 µm$^3$.

In an embodiment, the contoured structure 32 can be made of materials such as silicon, metal and metal alloys (e.g., copper, aluminum, brass), metal oxides, composite materials, polymers, diamond, or graphitic carbon.

In an embodiment, the flow channels 16 can have a width of about 50 nm to 50 µm. In an embodiment, the contoured structure 32 can form one or more of the walls of the flow channels 16. In an embodiment, the flow channels can be formed through the capillary trap-vapor pump 10, where the material surrounding the flow channels 32 can be made of material such as silicon, metal and metal alloys (e.g., copper, aluminum, brass), metal oxide, composite materials, polymers, diamond, or graphitic carbon.

FIG. 1 illustrates surfaces 36 and 38. In an embodiment, surfaces 36 (e.g., bottom of the contoured cavity 14 on the heated interface surface 12 and/or the sides of the contoured cavity 14 on the contoured structure 32) are inherently hydrophilic or include a layer of a hydrophilic material (e.g., silica, metal, metal oxide). In an embodiment, surfaces 38 (e.g., top of the contoured cavity 14 on the contoured structure 32 near the capillary opening 18 and/or on the inner surface of the capillary tube 22) are inherently hydrophobic or include a layer of a hydrophobic material/coating (e.g., TEFLON, PVC, silane treated). As described herein, the design of the contoured cavity 14 and the characteristics of surfaces 36 and 38 stabilize the vapor bubble. The rewetting speed is enhanced by using a hydrophilic surface, which increases rewetting speed and formation of the thin film so that the rate of heat transfer of the capillary trap-vapor pump 10 is increased In an embodiment, the capillary opening 18 and the capillary tube 22 can be positioned within the contoured structure 32. The capillary tube 22 can be interfaced with a pump or other device to remove the vapor. In an embodiment, the vapor can be recycled and used as the fluid in a closed loop system. In an embodiment, the surface of the capillary tube 22, at least adjacent the capillary opening 18, can be coated with a material to enhance formation and stability of the vapor bubble 24. For example use of a hydrophobic material (e.g., TEFLON, PVC, or silane treated) can be used to arrest the triple-phase (solid/liquid/vapor) contact line in order to enhance vapor bubble formation and stability. In an embodiment, the capillary opening can have a width or diameter of about 10 nm to 10 µm. In an embodiment, the capillary tube 22 can have a length of about 100 nm to 100 µm.

FIG. 1 illustrates an external transducer 42 (e.g., an actuator, such as a pressure transducer interfaced with the fluid in the cavity), that can be integrated into the capillary trap-vapor pump 10 to induce the dynamic oscillations of the vapor bubble, thus resulting in a time-averaged increase in the heated area covered by the thin film of fluid and therefore an enhancement in the heat dissipation capabilities of the capillary trap-vapor pump 10. The frequency of these externally driven oscillations can be selected such that it matches the natural (i.e., resonant) frequency of the contoured cavity 14, in order to the minimize the external power input required to drive the transducer, while enhancing the amplitude of the liquid meniscus motion and favorable liquid film thinning desirable for enhancing the rates of heat transfer by evaporation. In an embodiment, the transducer can be selected from a piezoelectric transducer or a capacitive (membrane) actuator (e.g., CMUT—Capacitive Micromachined Ultrasonic Transducer), and frequency of induced pressure oscillations could be about 10 to 300 MHz.

In an embodiment, the operating pressure to flow the fluid through the flow channels can be about 10 kPa to 10 MPa. One or more pumps can be used to flow the fluid. It should be noted that a pump, such as gear, peristaltic, electrosmotic, piezo pumps, can be used as pumps and are generally transducers. It should be noted that another transducer can be used to introduce flow oscillations, such as acoustic waves, on top of the bulk flow to produce resonant behavior of the vapor bubble for enhanced vapor pumping and thinning the liquid film due to dynamically moving the three-phase constant lines In an embodiment, the temperature of the fluid can be about 10 to 100° C.

As described generally above, the capillary trap-vapor pump 10 can operate by flowing a fluid into the contoured cavity 14 using the flow channels 16 so that the fluid contacts the heated interface surface 12. Thermal energy from the hot spot causes the fluid to evaporate and form a vapor bubble 24. The vapor bubble 24 is stabilized within the contoured cavity 14 adjacent the heated interface surface 12. Vapor from the vapor bubble 24 can be removed through the capillary opening 22 due to the differential pressure in the vapor bubble $P_1$ and the capillary tube 22 $P_2$. In an embodiment, P1 can be about 1.5 atm (150 kPa) to 150 atm (<50 atm or 5 MPa) and P2 can be about 1 atmosphere (100,000 Pa) or lower sub-atmospheric (if vacuum suction is used). As the vapor is removed from the vapor bubble 24, the vapor bubble 24 will decrease in volume. The vapor bubble 24 cycles in volume as a function of the flow rate of the fluid, the heat transferred, $P_1$, $P_2$, resonance cycle, and the like, but will be a stable steady state bubble. Parameters such as the flow rate of the fluid, $P_2$, surface temperature, cavity geometry and surface contact angles, and the like can be adjusted to optimize the removal of the vapor and transferred thermal energy, while retaining the stability of the vapor bubble 24.

Embodiments of the capillary trap-vapor pump and/or the global heat dissipater structure can include, but are not limited to, connecting pipes, valves, pumps (e.g., vapor or fluid), temperature sensors, flow rate and pressure sensors or meters, heat flux sensors, interface/packaging materials, and the like.

As used herein, the term "adjacent" refers to the relative position of one or more features or structure, where such relative position can refer to being near or adjoining. Adjacent structures can be spaced apart from one another or can be in actual contact with one another. In some instances, adjacent structures can be coupled to one another or can be formed integrally with one another. The meaning of the term "adjacent" can have different meanings depending on the term that is being referred to, so one meaning of the term is not restrictive of another use of the term unless specifically referenced. The present disclosure and figures as well as engineering and scientific knowledge within this area can be used to determine the appropriate meaning to be applied.

EXAMPLES

Figure 3:
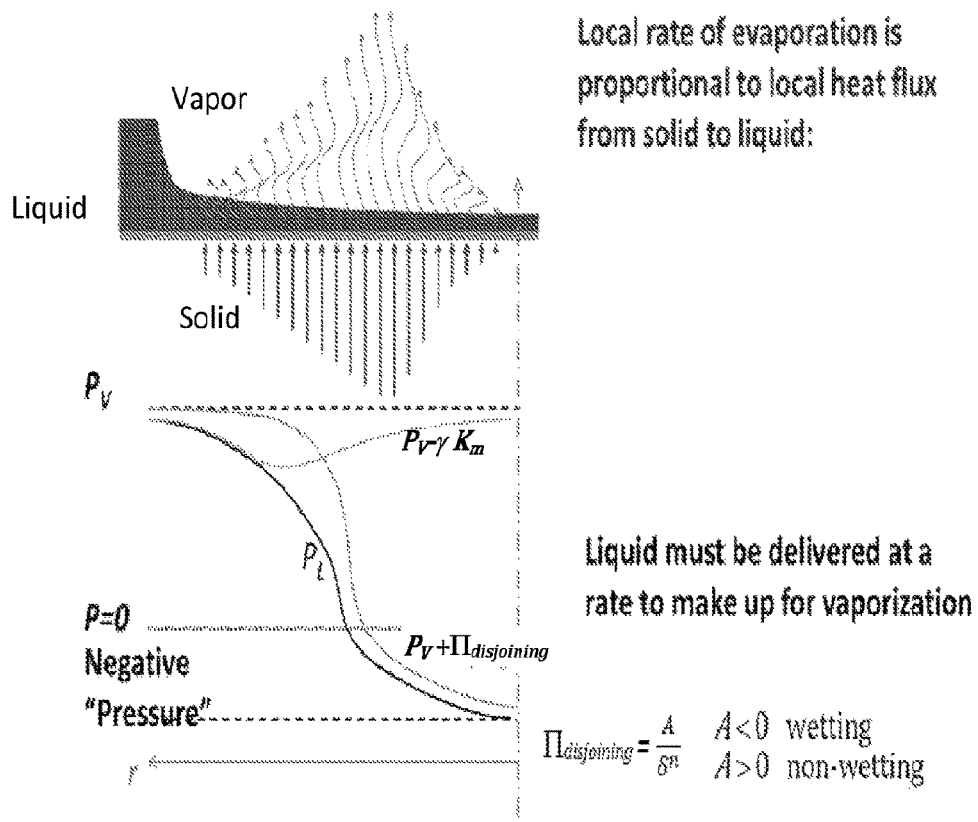
FIG. 3 illustrates a schematic representation of the vapor mass flux distribution as function of the liquid layer thickness at the bottom of the cavity (FIG. 1) of the device.

FIGS. 3 through 5 provide an example of a device operation under the steady-state conditions, i.e., without an externally induced oscillation of the vapor bubble, and sets the limits of performance for two representative liquid coolants (water and dielectric F72). The figure captions provide a detailed description of the analyzed conditions and establish the specific values of the expected dimensions/operating conditions to achieve dissipation of heat fluxes between 1 and 5 kW/cm².

In particular, FIG. 3 illustrates a schematic representation of the vapor mass flux distribution as function of the liquid layer thickness at the bottom of the contoured cavity of the device. In general, evaporation mass flux is lower in the region near the periphery where the liquid film is thicker due to a large conduction heat transfer resistance across the film and in increasing towards the centerline of the cavity at the film thickness decreases. However, beyond certain "adiabatic" film thickness, van der Waals force prevent further evaporation, and the vapor mass flux starts to the decrease. The idealized optimal film thickness is such that it is uniformly equal to the thickness when the maximum evaporation flux occurs, and this would result in the kinetic limit of maximum heat flux that could be achieved due to the thin evaporation of the liquid. The expression for the maximum (kinetic) heat flux limit is shown in Figure, as well as representative values for achievable magnitudes of heat dissipation for water and dielectric liquid (FC-72) as coolants.

In reference to FIG. 4, FIG. 4 illustrates the analysis of dominant resistances to evaporation heat transfer in the steady-state, uniform thickness film approximation. Resistances due to heat transfer across the liquid film ($R_L$). liquid-vapor interface ($R_{LV}$) and in the vapor phase ($R_v$) are computed using temperatures of the solid ($T_S$) and liquid-vapor ($T_{LV}$)/vapor-liquid ($T_{SL}$) interface (assuming no thermal equilibrium between the phases), as well as pressures in liquid ($P_L$) and vapor ($P_v$) phases and at the interface ($P_{LV}$) assumed to be in mechanical equilibrium. By comparing the magnitude of the heat flux due to conduction with the kinetic limit (bottom left figure) for the representative operating conditions, the optimal film thickness of different coolant can be determined to be in the range of 10-100 nm for FC-72 and 100-1000 nm for water. Using the mass transfer resistance for vapor removal from the interface upon evaporation (right bottom figure), one can determine the cross-over removal distance ($L_s$) when vapor transport transitions from sonically-dominated to friction-dominated (expected in real devices) for a given diameter of the evaporating zone ($D_h$) for different limits. For example, for a ~10 micrometer in diameter evaporating film of water, vapor removal for distances beyond 10 micrometers will be governed by the frictional limit.

In reference to FIG. 5, the left panel illustrates how the ability to supply liquid into the contoured cavity of the device due to the capillary pressure forces induced by interface curvature defines the maximum heat flux that can be dissipated due to liquid film evaporation. By considering a hemispherical liquid film interface within the cavity as a tractable idealization of the problem, the results indicate that heat fluxes of ~1 kW/cm² and ~5 kW/cm² can be removed from the disk area of the radius ~300 nm and ~100 nm, respectively, if the radius of curvature of the hemisphere is 1 micrometer. Further reduction in the radius of curvature of the liquid meniscus (e.g., using transient pulsatile operation) would enhance the supply of liquid and therefore increase the film extent over which the high heat flux dissipation can be achieved. FIG. 5, right panel, illustrates the distance ($L_s$) that would be required for vapor removal from evaporating interface for two different value of the dissipated heat flux (1 kW/cm$^2$ and 5 kW/cm$^2$) and varying size/lateral extent of the evaporating film (water is a coolant). The results indicate that, for example, in order to remove 1 kW/cm$^2$ from a 600 nm in diameter liquid film of water by evaporation one needs to ensure that the vapor removal distance (the length between the interface where it is generated and the point where it rejected to the ambient) must be ~5 micrometers. Further increase in the distance for the vapor removal would be desirable for practical implementation of the cooling devices, and this can be achieved by forced vapor pumping due to oscillatory liquid meniscus when a device is operated in a transient, pulsatile manner.

Figure 10:
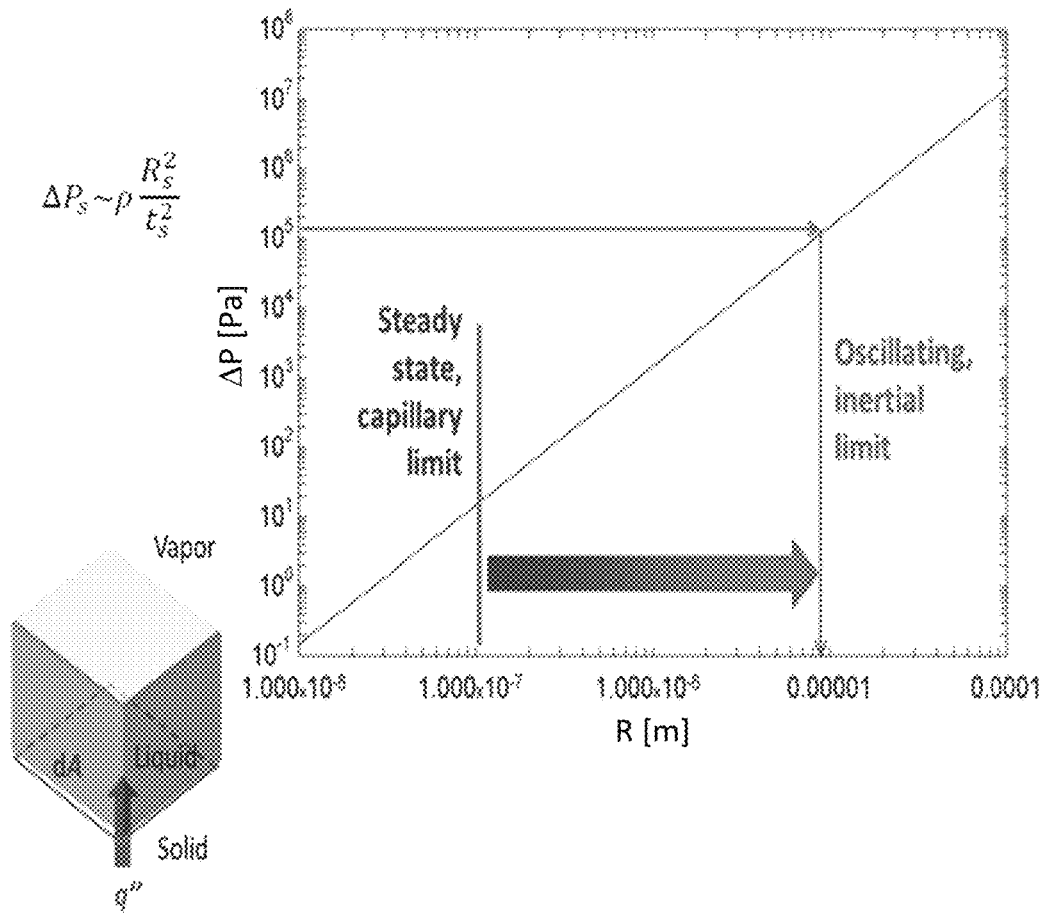
FIG. 10 illustrates representative results—analysis indicates that by using the conical cavity capable of stabilizing an oscillating bubble, one can exploit the induced pressure fluctuations to extend the domain covered by sufficiently thin, yet stable evaporating liquid (water in this example) film by about 2 orders of magnitude (e.g., from about 100 nm to 10 µm), thereby expanding substantially the area over which the high heat fluxes (5 kW/cm$^2$ in this particular example) can be dissipated without exceeding the specified heated wall temperature (85° C. in this example).

FIGS. 6 through 10 provide an example of a device with a conical cavity shape for evaporating bubble stabilization and describes the importance of the cavity shape (e.g., by comparting to a simple "cylindrical" oscillating bubble, FIGS. 7-8) on achieving the system operation without dry-out of the liquid coolant film above the heated surface. FIGS. 9-10 exemplifies the performance improvement, which can be achieved by using stable oscillatory evaporating bubble within the cavity, including a 2 order of magnitude increase in the cooled area when the bubble is resonated within the cavity at ~1-10 MHz frequencies.

Figure 6:
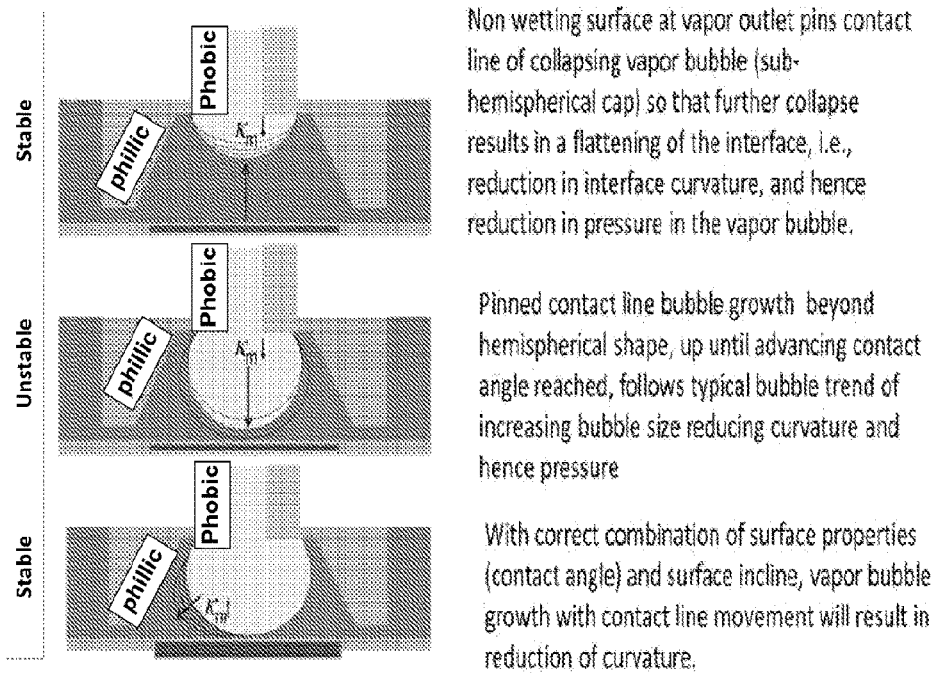
FIG. 6 illustrates the demonstration of a using a transient (oscillating) liquid meniscus confined within the device cavity to achieve a stable (bottom last figure) state of a thin film, which is greater in lateral extent than that in a steady-state mode of operation, thus providing a capability for an increased power dissipation (heat flux) by liquid coolant evaporation as compared to the steady-state behavior (FIGS. 3-5).

In particular, FIG. 6 illustrates the demonstration of a using a transient (oscillating) liquid meniscus confined within the device cavity to achieve a stable (bottom last figure) state of a thin film, which is greater in lateral extent than that in a steady-state mode of operation, thus providing a capability for an increased power dissipation (heat flux) by liquid coolant evaporation as compared to the steady-state behavior (FIGS. 3-5). It requires an appropriately selected combination of wetting properties of the cavity walls, pinning the contact line at the outlet of the cavity, and geometry of the cavity to stabilize the vapor bubble within the cavity upon transient oscillations of the liquid meniscus.

FIG. 7 illustrates the effect of the cavity shape on the bubble/film stabilization upon forced oscillation—governing equations for analysis of the "cylindrical" vapor bubble behavior inside the cavity. R refers to the radius of the cavity, H is the cavity height, p and μ are density and viscosity of the coolant, respectively, P and T are pressure and temperature, respectively, and γ is the fluid surface tension. Subscript "0" refers to initial conditions, and "co" refers to the far-field (cavity outer walls).

FIG. 8 illustrates the effect of the cavity shape on the bubble/film stabilization upon forced oscillation—results of the analysis indicate that the cylindrical cavity (with the heated surface and the confining surface parallel to each other) is unable to stabilize the oscillatory vapor bubble upon coolant evaporation, which leads to either the bubble collapse (upper figure) or uncontrollable growth (lower figure); the conical (and other close in shape) cavity configuration is critical to achieve the stable vapor bubble within the cavity and to avoid the film dry-out at the bottom (heated) surface of the cavity.

Oscillating bubble stabilization is achieved within a conical cavity of the unity aspect ratio (height H/radius R=1) and the 30° apex angle when the bubble shape factor, defined by the maximum mean curvature normalized by the cavity radius R, reaches its minimum at the bubble volume equal to ~0.45 of the total volume of the cavity (FIG. 9). The analysis indicates that by using the conical cavity capable of stabilizing an oscillating bubble, one can exploit the induced pressure fluctuations to extend the domain covered by sufficiently thin, yet stable evaporating liquid (water in this example) film by ~2 orders of magnitude (e.g., from ~100 nm to ~10 μm), thereby expanding substantially the area over which the high heat fluxes (5 kW/cm$^2$ in this particular example) can be dissipated without exceeding the specified wall temperature (85° C. in this example) (FIG. 10).

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding based on numerical value and the measurement techniques. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

Therefore, the following is claimed:

1. A capillary trap-vapor pump, comprising:
   a heated interface surface for receiving thermal energy,
   a contoured cavity adjacent the heated interface surface,
   at least one flow channel, wherein the at least one flow channel is configured to flow a fluid to the heated interface surface, where the at least one flow channel opens into the contoured cavity; and
   a capillary opening disposed above the heated interface surface, wherein the capillary opening is an opening of a capillary tube at a first end of the capillary tube, wherein the capillary opening forms a top boundary of the contoured cavity, wherein the heated interface surface forms a boundary of the contoured cavity, wherein side surfaces of a contoured structure forms a side boundary of the contoured cavity; and
   wherein the heated interface surface causes the fluid to evaporate and form a vapor bubble within the contoured cavity, wherein the vapor is removed from within the vapor bubble using the capillary tube,
   wherein the side surfaces of the contoured structure are hydrophilic, wherein a surface of the heated interface surface is hydrophilic, wherein an inside surface of the capillary tube is hydrophobic.

2. The capillary trap-vapor pump of claim 1, wherein at least one surface comprises a hydrophilic coating disposed thereon, the at least one surface selected from a group consisting of: the side surfaces of the contoured structure the surface of the heated interface surface, and a combination thereof.

3. The capillary trap-vapor pump of claim 1, wherein a first pressure in the vapor bubble is greater than a second pressure in the capillary tube.

4. The capillary trap-vapor pump of claim 1, wherein the contoured cavity has a volume of 100,000 nm$^3$ to 100,000 µm$^3$.

5. The capillary trap-vapor pump of claim 1, wherein the capillary opening has a width or diameter of about 10 nm to 10 µm.

6. The capillary trap-vapor pump of claim 1, wherein the contoured cavity has a conical shape extending down from the capillary opening toward a bottom surface of the contoured cavity, the bottom surface being opposite the opening of the capillary opening.

7. The capillary trap-vapor pump of claim 1, wherein a thin film of the fluid is positioned between the contoured cavity and the heated interface surface, wherein the thin film acts to remove heat from the heated interface surface by evaporating the fluid to form the vapor bubble.

8. The capillary trap-vapor pump of claim 1, wherein the heated interface surface is adjacent a hot spot in a microelectronic device.

9. The capillary trap-vapor pump of claim 8, wherein the hot spot has a heat flux of about 100 W/cm$^2$ to 1000 W/cm$^2$.

10. The capillary trap-vapor pump of claim 1, further comprising a transducer interfaced with the fluid and configured to operate at resonance with the contoured cavity.

* * * * *